United States Patent
Wu et al.

(10) Patent No.: US 8,566,664 B2
(45) Date of Patent: Oct. 22, 2013

(54) SYSTEM AND METHOD FOR CORRECTING ERRORS IN NON-VOLATILE MEMORY USING PRODUCTS CODES

(75) Inventors: Zining Wu, Los Altos, CA (US); Pantas Sutardja, Los Gatos, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 13/280,168

(22) Filed: Oct. 24, 2011

(65) Prior Publication Data

US 2012/0042224 A1    Feb. 16, 2012

Related U.S. Application Data

(62) Division of application No. 11/820,934, filed on Jun. 21, 2007, now Pat. No. 8,046,660.

(60) Provisional application No. 60/821,654, filed on Aug. 7, 2006.

(51) Int. Cl.
*H03M 13/00* (2006.01)

(52) U.S. Cl.
USPC ............................................ 714/755

(58) Field of Classification Search
USPC ............................................... 714/755
See application file for complete search history.

(56) References Cited

U.S. PATENT DOCUMENTS

| | | | |
|---|---|---|---|
| 4,688,219 A | 8/1987 | Takemae | |
| 5,719,884 A * | 2/1998 | Roth et al. | 714/755 |
| 6,017,496 A * | 1/2000 | Nova et al. | 506/28 |
| 6,079,043 A | 6/2000 | Yoshiura et al. | |
| 7,003,712 B2 * | 2/2006 | Martinian et al. | 714/761 |
| 7,356,752 B2 | 4/2008 | Hewitt et al. | |
| 7,802,163 B2 * | 9/2010 | Tan | 714/752 |
| 2002/0034269 A1 | 3/2002 | Demjanenko et al. | |
| 2002/0049947 A1 | 4/2002 | Sridharan et al. | |
| 2002/0083391 A1 * | 6/2002 | Huggett et al. | 714/777 |
| 2002/0099996 A1 | 7/2002 | Demura et al. | |
| 2004/0123223 A1 | 6/2004 | Halford | |
| 2005/0273688 A1 * | 12/2005 | Argon | 714/755 |
| 2007/0171714 A1 * | 7/2007 | Wu et al. | 365/185.09 |

OTHER PUBLICATIONS

Sudhakar M. Reddy, Random Error and Burst Correction by Iterated Codes, 1972, IEEE, 18, pp. 182-185.*
International Search Report for Application No. PCT/US2007/017450 (corresponding hereto) mailed Jan. 25, 2008.

* cited by examiner

*Primary Examiner* — Albert Decady
*Assistant Examiner* — Enam Ahmed

(57) ABSTRACT

A product code encoder for non-volatile (NV) memory includes a first encoder that encodes data in codewords in a first dimension that is stored in the NV memory. The product code encoder also includes a second encoder that encodes data in codewords in a second dimension that is stored in the NV memory. A product code codeword is based on the codewords in the first dimension and the codewords in the second dimension.

13 Claims, 14 Drawing Sheets

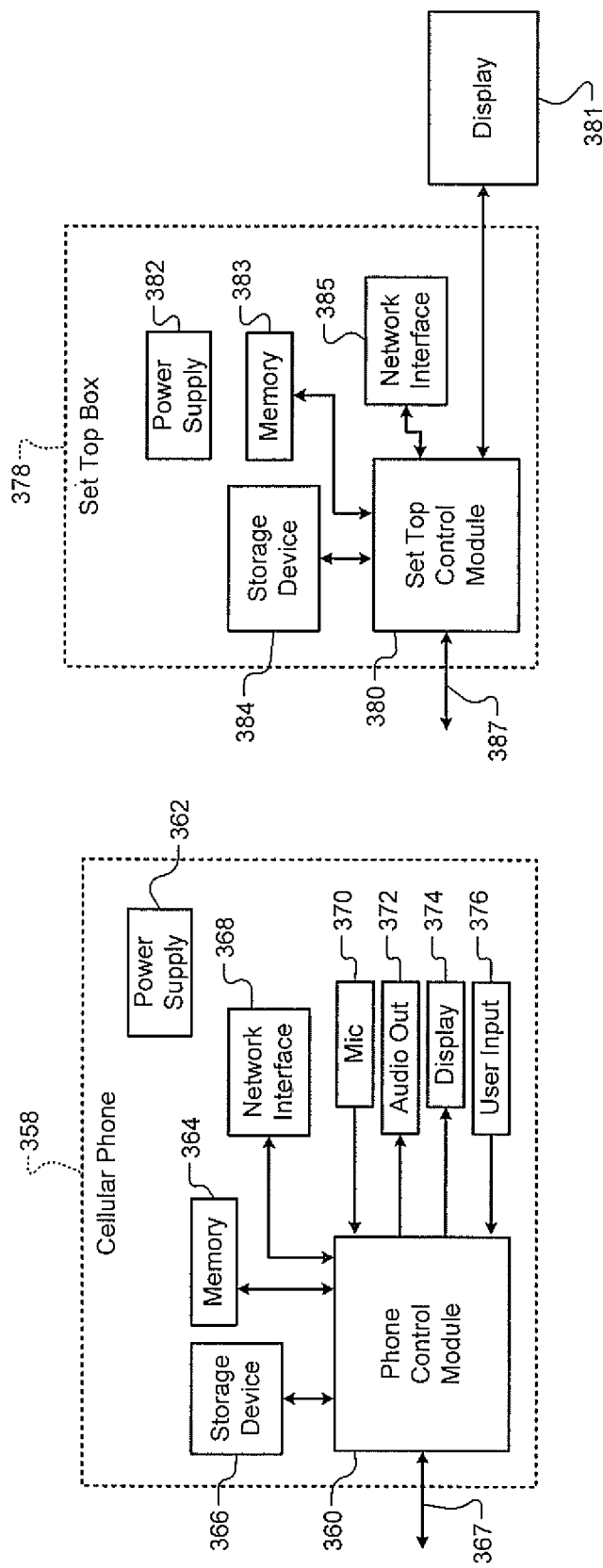

SYSTEM AND METHOD FOR CORRECTING ERRORS IN NON-VOLATILE MEMORY USING PRODUCTS CODES

CROSS-REFERENCE TO RELATED APPLICATIONS

This present application is a divisional of U.S. application Ser. No. 11/820,934, filed on Jun. 21, 2007 which claims priority under 35 U.S.C. §119(e) to U.S. Provisional Application No. 60/821,654, filed on Aug. 7, 2006.

FIELD

The present disclosure relates to memory systems and more particularly to error correction for memory systems.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIG. 1, non-volatile semiconductor memory 10 may include flash memory, static random access memory (SRAM), nitride read only memory (NROM), magnetic RAM, Phase-change memory (PRAM), etc. A memory controller 12 may write and read data to NV memory 10 through write and read paths 14, 16. Data corruption or errors in NV memory 10 may occur in the form of interference, such as intersymbol interference, and/or noise "n".

Referring now to FIGS. 1 and 2, an encoder 18 of the write path 14 may receive a data stream U and may apply an error correcting code (ECC) to data to generate an encoded signal Y. NV memory 10 may store encoded data. A decoder 24 of the read path 16 may use the ECC to detect and correct errors in a read signal Y' to generate a data stream U'. U' may resemble U.

The encoder 18 may encode U in a one dimensional (1D) array 30. The array 30 may include a series of rows 31-1, 31-2, . . . , and 31-M (collectively rows 31) of length N. Each row may contain a user data area 32 of length K and an overhead data area 34 of length N-K that may contain ECC encoded data. K and N-K may be based on the number of bits stored in respective areas 32, 34.

The decoder 24 may analyze the ECC encoded data during a read operation to determine if there is an error and/or to correct such an error. ECCs may include common coefficients for specialized polynomial equations. When the data is read out of NV memory 10, the data integrity may be checked by regenerating these coefficients from the read data. If the regenerated and stored ECCs do not "match", an error may have been detected.

Exemplary ECCs include Hamming codes, Reed-Solomon (RS) codes, and Bose-Chaudhuri-Hochquenghem (BCH) binary codes. Other ECCs include cyclic redundancy codes (CRC), Golay codes, Reed-Muller codes, Goppa codes, low-density parity-check (LDPC) codes, turbo codes, convolutional codes, trellis coded modulation (TCM), block coded modulation (BCM), etc.

The decoder 24 may recover the data but there may be some acceptably small probability of incorrect recovery. However, the probability of reliable data recovery may decrease rapidly with an increasing number of errors. Once an error in read data is detected, the decoder 24 may attempt to correct and/or erase the error.

Hamming distance is a measure of the error detection and correction capability of a code. The Hamming distance between two data words is the number of positions for which the corresponding bits are different. In other words, Hamming distance measures the number of substitutions required to change one word into another, or the number of errors that transformed one word into another. For example, the Hamming distance between 1111 and 1001 is 2. The Hamming distance between 1111 and 0001 is 3.

To detect E digits in error, a code of a minimum Hamming distance of (E+1) may be required. To correct E errors, a code must display a minimum Hamming distance of (2E+1). The minimum distance is indicative of an amount of noise that the system can tolerate before a stored codeword is decoded erroneously.

SUMMARY

A product code encoder for non-volatile (NV) memory includes a first encoder that encodes data in codewords in a first dimension that is stored in the NV memory. The product code encoder also includes a second encoder that encodes data in codewords in a second dimension that is stored in the NV memory. A product code codeword is based on the codewords in the first dimension and the codewords in the second dimension.

In other features, at least one of the first and second dimension codewords is based on a code selected from a group consisting of a Hamming code, a Reed-Solomon (RS) code, and a Bose-Chaudhuri-Hochquenghem (BCH) binary code. The group also consists of a cyclic redundancy code, a Golay code, a Reed-Muller code, a Goppa code, low-density parity-check (LDPC) codes, turbo codes, convolutional codes, trellis coded modulation (TCM), block coded modulation (BCM).

In other features, at least one of the first and second encoders includes a product code encoder. The product code codeword is based on a product of the codewords in the first dimension and the codewords in the second dimension. The first dimension includes a row and the second dimension includes a column.

In other features, a NV memory system includes the product code encoder and a product code decoder. The product code decoder decodes the first dimension codewords and the second dimension codewords from the NV memory. The NV memory includes at least one of flash memory, static random access memory (SRAM), nitride read only memory (NROM), magnetic RAM, and phase-change memory (PRAM). A burst code decoder operates parallel to the product code decoder. The burst code decoder decodes at least one of the first dimension codewords and the second dimension codewords.

In other features, the NV memory system includes a modulator that modulates signals from the product code encoder during a write operation. A demodulator demodulates data stored in the NV memory during a read operation. The product code decoder includes a row decoder that decodes the first dimension codewords and a column decoder that decodes the second dimension codewords.

In other features, when the row decoder detects an error in one of the first dimension codewords, one of the first dimension codewords is marked as an erasure. The column decoder detects another error in one of the second dimension codewords based on the erasure. The product code decoder iterates between the row and column decoders to determine other errors in the first and second dimension codewords. The row decoder determines that one of the first dimension codewords is miscorrected based on a number of errors in the first dimension codeword and erases the first dimension codeword.

In other features, the product code decoder erases a number of least reliable first dimension codewords and repeats decoding for one of the second dimension codewords when failing to decode one of the second dimension codewords. When the product code decoder decodes one of the second dimension codewords but alters a symbol in one of the first dimension codewords, the product code decoder erases a number of least reliable first dimension codewords. The product code decoder then repeats decoding for the one of the second dimension codewords. The product code encoder further includes N encoders that encode data in codewords in N dimensions that is stored in the NV memory. A product code codeword is based on a product of the codewords in the N dimensions, where N is an integer greater than or equal to three.

In other features, a product code decoder includes a first decoder that decodes first dimension codewords that are stored in NV memory. The product code decoder also includes a second decoder that decodes second dimension codewords that are stored in the NV memory. A product code codeword is based on the first dimension codewords and the second dimension codewords.

In other features, the first dimension includes a row and the second dimension includes a column. The product code codeword is based on a product of the first dimension codewords and the second dimension codewords. At least one of the first and second decoders includes a product code decoder. When the first decoder detects an error in one of the first dimension codewords, that one of the first dimension codewords is marked as an erasure. The second decoder detects another error in one of the second dimension codewords based on the erasure.

In other features, the first and second decoders iterate to determine other errors in the first and second dimension codewords. The first decoder determines that one of the first dimension codewords is miscorrected based on a number of errors in the first dimension codeword and erases the first dimension codeword. When the second decoder fails to decode one of the second dimension codewords, one of the first and second decoders erases a number of least reliable first dimension codewords. The second decoder then repeats decoding for the one of the second dimension codewords.

In other features, one of the first and second decoders erases a number of least reliable first dimension codewords when the second decoder decodes one of the second dimension codewords but alters a symbol in one of the first dimension codewords. The second decoder then repeats decoding for the one of the second dimension codewords.

In other features, at least one of the first and second dimension codewords is based on a code selected from a group consisting of a Hamming code, a Reed-Solomon (RS) code, and a Bose-Chaudhuri-Hochquenghem (BCH) binary code. The group further consists of a cyclic redundancy code (CRC), a Golay code, a Reed-Muller code, a Goppa code, low-density parity-check (LDPC) codes, turbo codes, convolutional codes, trellis coded modulation (TCM), block coded modulation (BCM).

In other features, a NV memory system includes the product code decoder. The NV memory includes at least one of flash memory, static random access memory (SRAM), nitride read only memory (NROM), magnetic RAM, and phase-change memory (PRAM). The memory system also includes a product code encoder comprising a row encoder that encodes the first dimension codewords and a column encoder that encodes the second dimension codewords. The product code decoder includes N decoders that decode data in codewords in N dimensions that is stored in the NV memory. A product code codeword is based on a product of the codewords in the N dimensions, where N is an integer greater than or equal to three.

In other features, a method for encoding a product code includes encoding data in codewords in a first dimension that is stored in NV memory. The method also includes encoding data in codewords in a second dimension that is stored in the NV memory. A product code codeword is based on the codewords in the first dimension and the codewords in the second dimension. The product code codeword is based on a product of the codewords in the first dimension and the codewords in the second dimension. The first dimension includes a row and the second dimension includes a column.

In other features, the method includes encoding data in codewords in N dimensions that is stored in the NV memory. A product code codeword is based on a product of the codewords in the N dimensions, where N is an integer greater than or equal to three.

In other features, a method for decoding a product code includes decoding first dimension codewords that are stored in NV memory. The method also includes decoding second dimension codewords that are stored in the NV memory. A product code codeword is based on the first dimension codewords and the second dimension codewords. The first dimension includes a row and the second dimension includes a column. The product code codeword is based on a product of the first dimension codewords and the second dimension codewords.

In other features, the method includes detecting an error in one of the first dimension codewords and marking that one of the first dimension codewords as an erasure. The method also includes detecting another error in one of the second dimension codewords based on the erasure. The method also includes determining that one of the first dimension codewords is miscorrected based on a number of errors in the first dimension codeword. The method also includes erasing the first dimension codeword.

In other features, the method includes erasing a number of least reliable first dimension codewords in response to failing to decode one of the second dimension codewords. The method also includes repeating decoding for the one of the second dimension codewords. The method also includes erasing a number of least reliable first dimension codewords when one of the second dimension codewords is decoded but a symbol in one of the first dimension codewords is altered. The method also includes repeating decoding for the one of the second dimension codewords.

In other features, at least one of the first and second dimension codewords is based on a code selected from a group consisting of a Hamming code, a Reed-Solomon (RS) code, and a Bose-Chaudhuri-Hochquenghem (BCH) binary code. The group also consists of a cyclic redundancy code (CRC), a Golay code, a Reed-Muller code, a Goppa code, low-density parity-check (LDPC) codes, turbo codes, convolutional codes, trellis coded modulation (TCM), block coded modulation (BCM).

In other features, a product code encoder for NV means for storing data includes first encoding means for encoding data in codewords in a first dimension that is stored in the NV memory means. The product code encoder also includes second encoding means for encoding data in codewords in a second dimension that is stored in the NV memory means. A product code codeword is based on the codewords in the first dimension and the codewords in the second dimension.

In other features, at least one of the first and second dimension codewords is based on a code selected from a group consisting of a Hamming code, a Reed-Solomon (RS) code, and a Bose-Chaudhuri-Hochquenghem (BCH) binary code. The group also consists of a cyclic redundancy code, a Golay code, a Reed-Muller code, a Goppa code, low-density parity-check (LDPC) codes, turbo codes, convolutional codes, trellis coded modulation (TCM), block coded modulation (BCM).

In other features, at least one of the first and second encoding means includes encoding means for encoding a product code. The product code codeword is based on a product of the codewords in the first dimension and the codewords in the second dimension. The first dimension includes a row and the second dimension includes a column.

In other features, a product code decoder includes first decoding means for decoding first dimension codewords that are stored in NV means for storing data. The product code decoder also includes second decoding means for decoding second dimension codewords that are stored in the NV memory means. A product code codeword is based on the first dimension codewords and the second dimension codewords. The first dimension includes a row and the second dimension includes a column. The product code codeword is based on a product of the first dimension codewords and the second dimension codewords.

In other features, at least one of the first and second decoding means includes product code means for decoding. When the first decoding means detects an error in one of the first dimension codewords, that first dimension codeword is marked as an erasure. The second decoding means detects another error in one of the second dimension codewords based on the erasure. The first and second decoding means iterate to determine other errors in the first and second dimension codewords. The first decoding means determines that one of the first dimension codewords is miscorrected based on a number of errors in the first dimension codeword and erases the first dimension codeword.

In other features, one of the first and second decoding means erases a number of least reliable first dimension codewords when the second decoding means fails to decode one of the second dimension codewords. The second decoding means then repeats decoding for the one of the second dimension codewords. One of the first and second decoding means erases a number of least reliable first dimension codewords when the second decoding means decodes one of the second dimension codewords but alters a symbol in one of the first dimension codewords. The second decoding means then repeats decoding for the one of the second dimension codewords.

In other features, at least one of the first and second dimension codewords is based on a code selected from a group consisting of a Hamming code, a Reed-Solomon (RS) code, and a Bose-Chaudhuri-Hochquenghem (BCH) binary code. The group also consists of a cyclic redundancy code (CRC), a Golay code, a Reed-Muller code, a Goppa code, low-density parity-check (LDPC) codes, turbo codes, convolutional codes, trellis coded modulation (TCM), block coded modulation (BCM).

In other features, a computer program stored for use by a processor for operating a product code encoder for NV memory includes encoding data in codewords in a first dimension that is stored in the NV memory. The computer program also includes encoding data in codewords in a second dimension that is stored in the NV memory. A product code codeword is based on the codewords in the first dimension and the codewords in the second dimension. The product code codeword is based on a product of the codewords in the first dimension and the codewords in the second dimension. The first dimension includes a row and the second dimension includes a column.

In other features, the computer program includes encoding data in codewords in N dimensions that is stored in the NV memory. A product code codeword is based on a product of the codewords in the N dimensions, where N is an integer greater than or equal to three.

In other features, a computer program for decoding a product code includes decoding first dimension codewords that are stored in NV memory. The computer program also includes decoding second dimension codewords that are stored in the NV memory. A product code codeword is based on the first dimension codewords and the second dimension codewords. The first dimension includes a row and the second dimension includes a column. The product code codeword is based on a product of the first dimension codewords and the second dimension codewords.

In other features, the computer program includes detecting an error in one of the first dimension codewords and marking one of the first dimension codewords as an erasure. The computer program also includes detecting another error in one of the second dimension codewords based on the erasure. The computer program also includes determining that one of the first dimension codewords is miscorrected based on a number of errors in the first dimension codeword. The computer program also includes erasing the first dimension codeword.

In other features, the computer program includes erasing a number of least reliable first dimension codewords in response to failing to decode one of the second dimension codewords. The computer program also includes repeating decoding for one of the second dimension codewords. The computer program also includes erasing a number of least reliable first dimension codewords when one of the second dimension codewords is decoded but a symbol in one of the first dimension codewords is altered. The computer program also includes repeating decoding for the one of the second dimension codewords.

In other features, at least one of the first and second dimension codewords is based on a code selected from a group consisting of a Hamming code, a Reed-Solomon (RS) code, and a Bose-Chaudhuri-Hochquenghem (BCH) binary code. The group also consists of a cyclic redundancy code (CRC), a Golay code, a Reed-Muller code, a Goppa code, low-density parity-check (LDPC) codes, turbo codes, convolutional codes, trellis coded modulation (TCM), block coded modulation (BCM).

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 11E is a functional block diagram of a cellular phone;

FIG. 11F is a functional block diagram of a set top box; and

DETAILED DESCRIPTION

Figure 1:
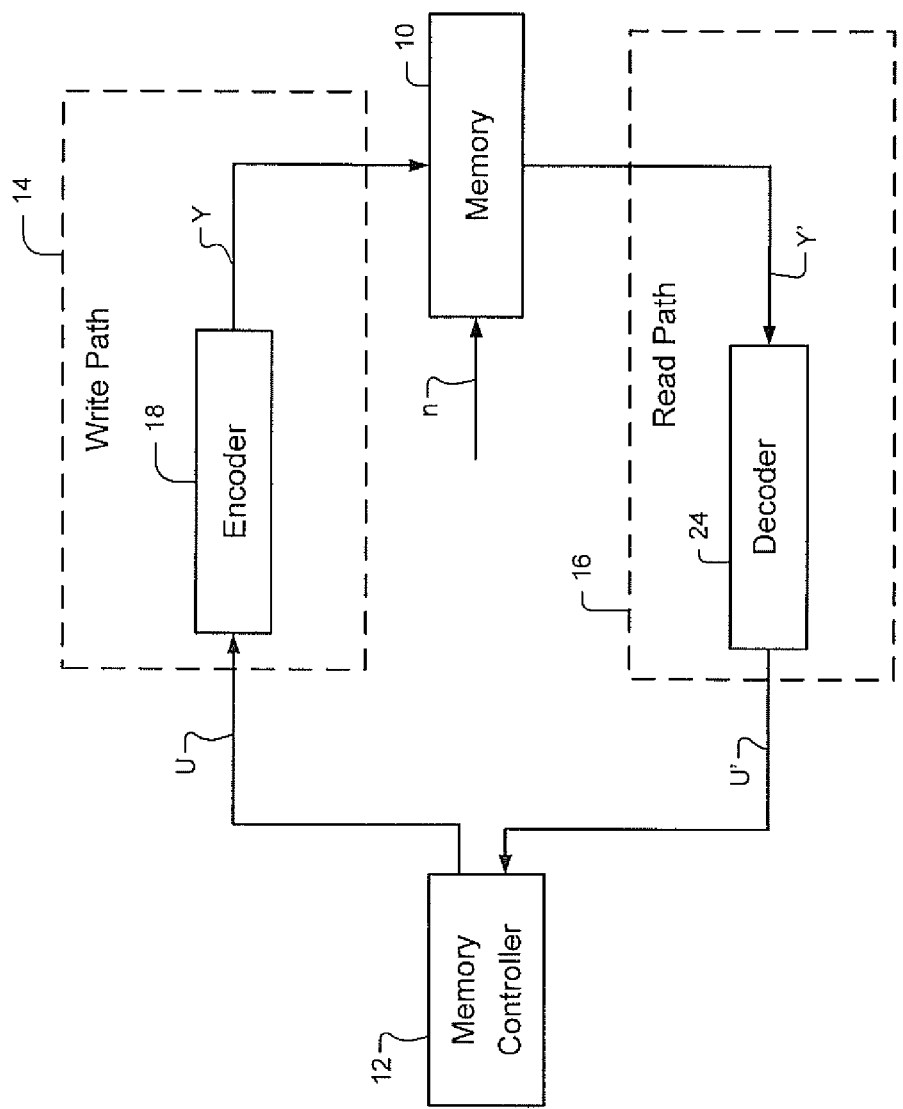
FIG. 1 is a functional block diagram of a memory system according to the prior art.
Figure 2:
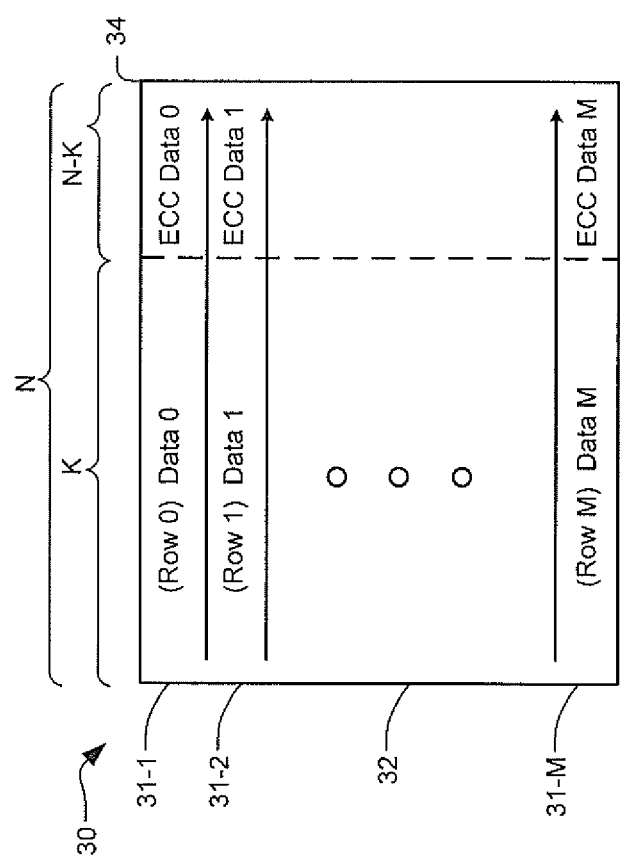
FIG. 2 is a schematic diagram of a memory array according to the prior art.

The following description is merely exemplary in nature and is in no way intended to limit the disclosure, its application, or uses. For purposes of clarity, the same reference numbers will be used in the drawings to identify similar elements. As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

The present disclosure relates to storing data in non-volatile (NV) memories using product codes.

Figure 3:
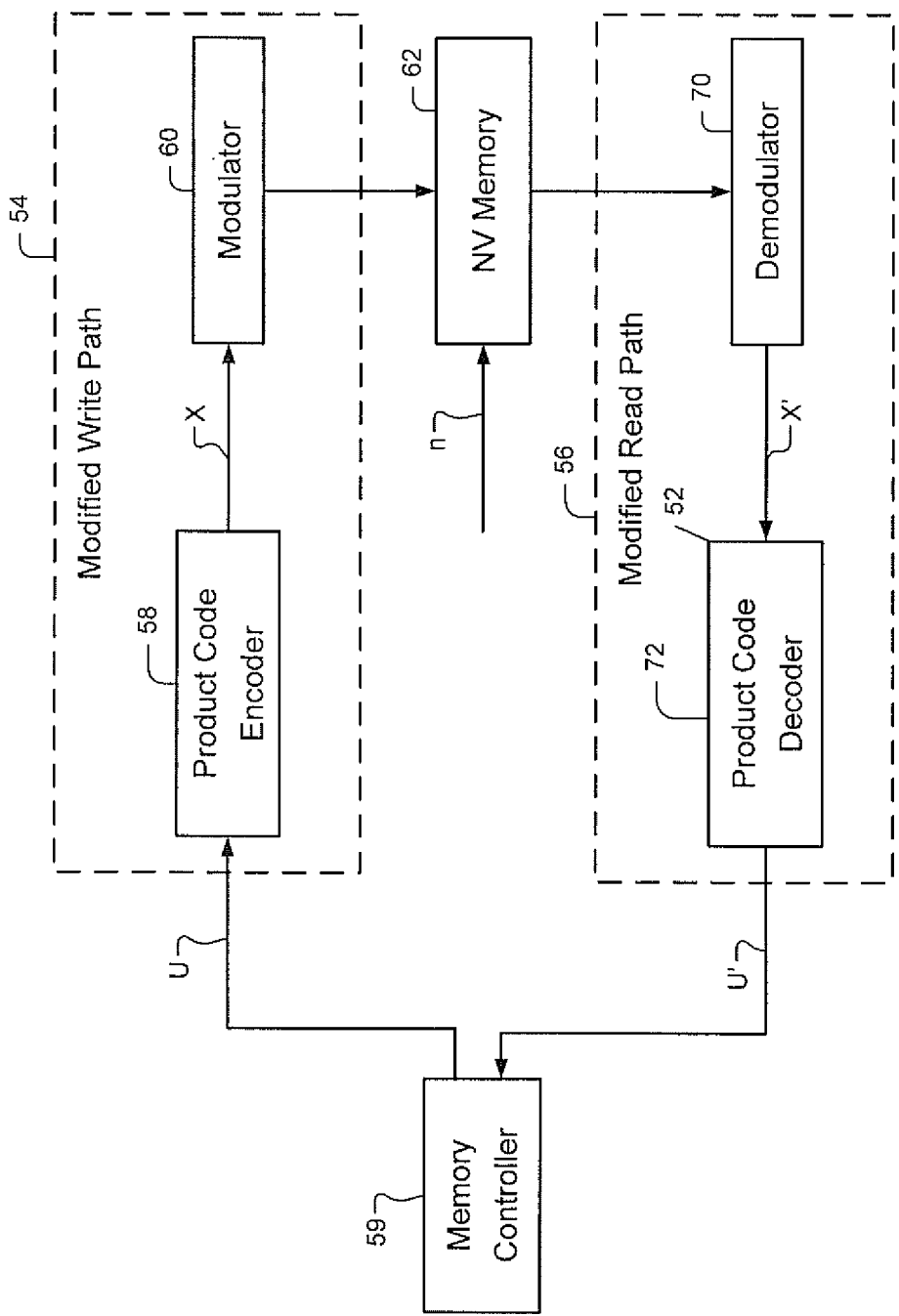
FIG. 3 is a functional block diagram of a memory system according to the present disclosure.

Referring now to FIG. 3, a memory storage system 50 includes a write path 54 and a read path 56. The write path 54 has a product code encoder 58 that receives an information data stream U from a memory controller 59 and generates a product code data stream X. The product code data stream X is received by a modulator 60 that modulates the data stream X into signals suitable for NV memory storage. The data stream X is then written to single-level cell (SLC) or multi-level cell (MLC) NV memory 62.

Signal "n" represents the noise or distortion that is experienced by and thus, in effect, added to the modulated signal within NV memory 62. The combination of the noise n and the modulated signal is received by a demodulator 70 of the read path 56. The demodulator 70 generates a received signal X', which is received by a product code decoder 72. The demodulator 70 may first quantize a read back voltage (or current) from NV memory cells and translate the readings to binary data X' that may include errors resulting from n.

If no error occurs during the read back process/demodulation, X' may be the same as X. In the event of errors, the product code decoder 72 may detect and/or clean errors in X' so that U' generally equals U.

Figure 5:
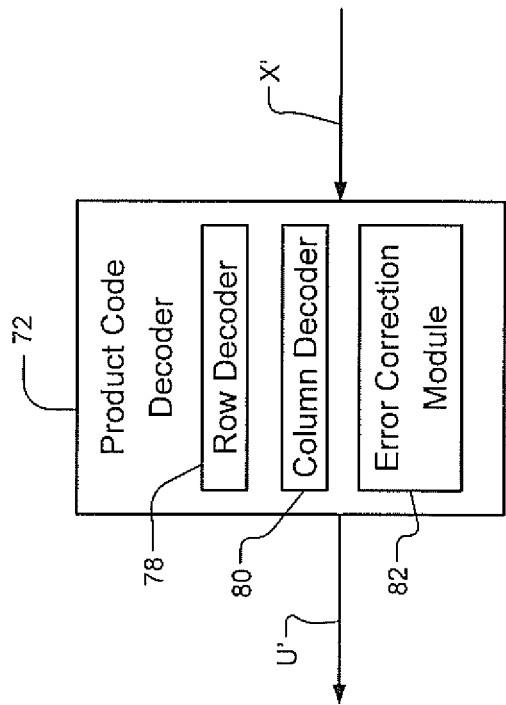
FIG. 5 is a functional block diagram of a product code decoder according to the present disclosure.
Figure 4:
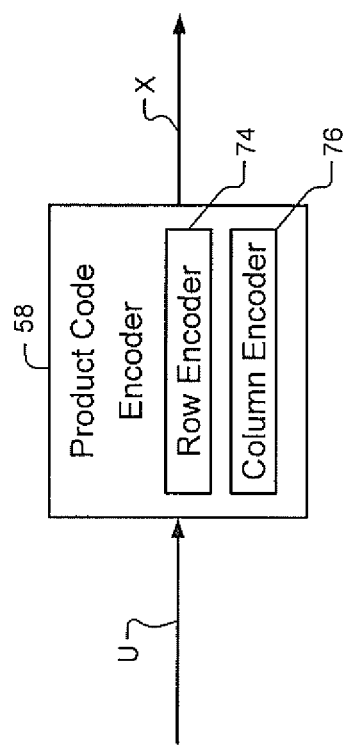
FIG. 4 is a functional block diagram of a product code encoder according to the present disclosure.

Referring now to FIGS. 4 and 5, data of a product code may be written and/or read by columns and/or by rows. The product code encoder 58 may include a row encoder 74 and a column encoder 76 that encode rows and columns of data to be written to NV memory 62. The product code decoder 72 may include a row decoder 78, a column decoder 80, and an error correction module 82. The row and column decoders 78, 80 decode rows and columns of the data read from NV memory 62 and may detect data errors. The error correction module 82 may correct data errors.

Figure 6A:
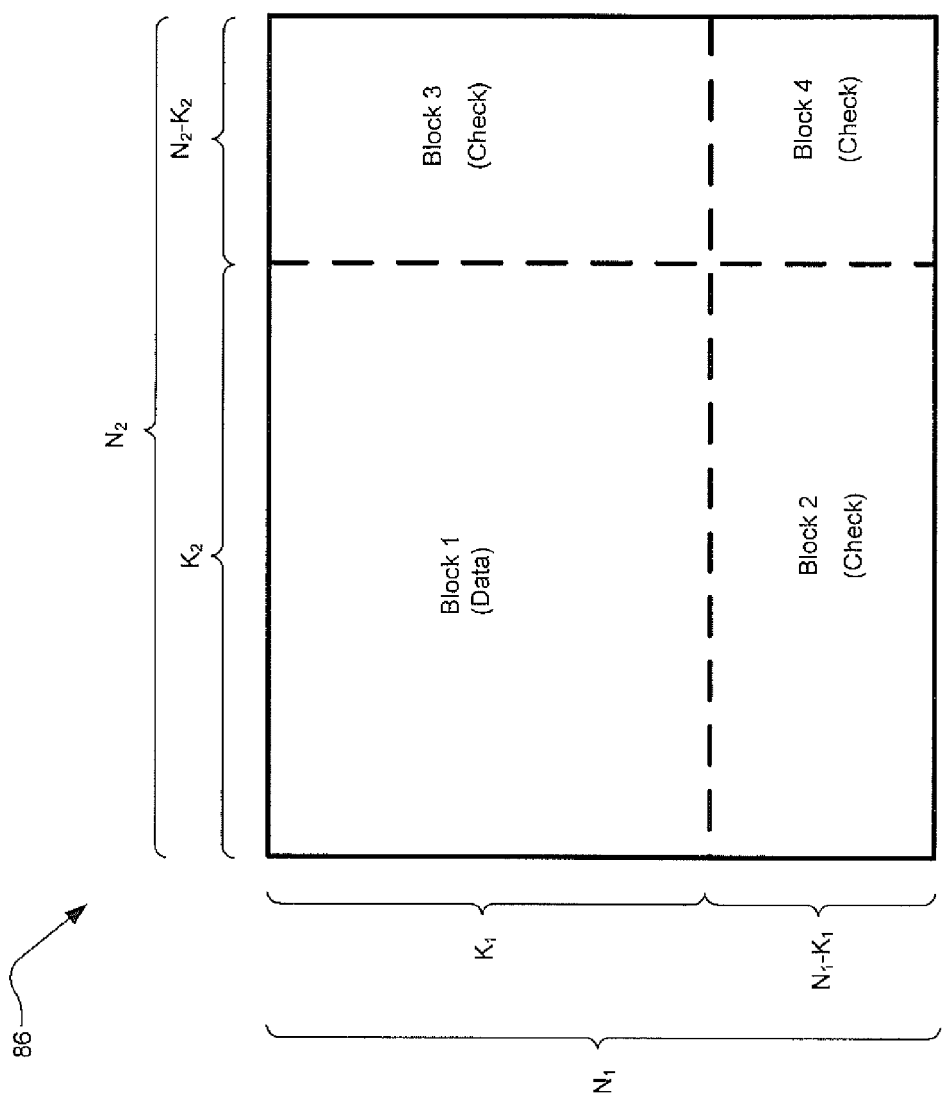
FIGS. 6A-6B are schematic diagrams of a memory array according to the present disclosure.

Referring now to FIG. 6A, the product code encoder 58 may encode data in an exemplary two dimensional (2D) product code ($C_p$) 86 during a write operation. $C_p = C_1 \times C_2$, where $C_1$ may represent a ($N_1$, $K_1$) code, which may be a binary linear code, in the vertical direction with a code length $N_1$ and data length $K_1$. $C_2$ may represent a ($N_2$, $K_2$) code, which may also be a binary linear code, in the horizontal direction with a code length $N_2$ and information length $K_2$. The product code 86 may represent a ($N_1 N_2$, $K_1 K_2$) linear code.

That is, $C_1$ and $C_2$ may have $K_1$ and $K_2$ data bits respectively that, after encoding, become $N_1$ and $N_2$ coded bits respectively. The product code may be constructed by first storing $K_1 \times K_2$ data bits in the 2D array of Block 1 with $K_1$ rows and $K_2$ columns. Block 1 may be represented by, $$\begin{pmatrix} D_{1,1} & \cdots & D_{1,K_2} \\ \vdots & \ddots & \vdots \\ D_{K_1,1} & \cdots & D_{K_1,K_2} \end{pmatrix} (D_{i,j} = 0, 1),$$

where D represents data and i,j represent rows and columns of a matrix. $D_{i,j}$ (i=1, 2, ..., $K_1$; j=1, 2, ..., $K_2$) may be 0 or 1. Block 2 may be constructed by providing individual columns from the 1st to $K_2$th column with ($N_1$-$K_1$) bit checks of the $C_1$ code. Block 2 may be represented as a 2D array with $N_1$-$K_1$ rows and $K_2$ columns. Blocks 3 and 4 may be constructed by subsequently providing individual rows from the 1st to $N_1$th row with ($N_2$-$K_2$) bit checks of the $C_2$ code.

Block 1 designates original data bits $K_1 \times K_2$, and Blocks 2-3 each designate checks on the original data bits. Block 4 may designate a redundant check for Blocks 2-3. Block 4 may therefore include ($N_1$-$K_1$)×($N_2$-$K_2$) check data.

Figure 6B:
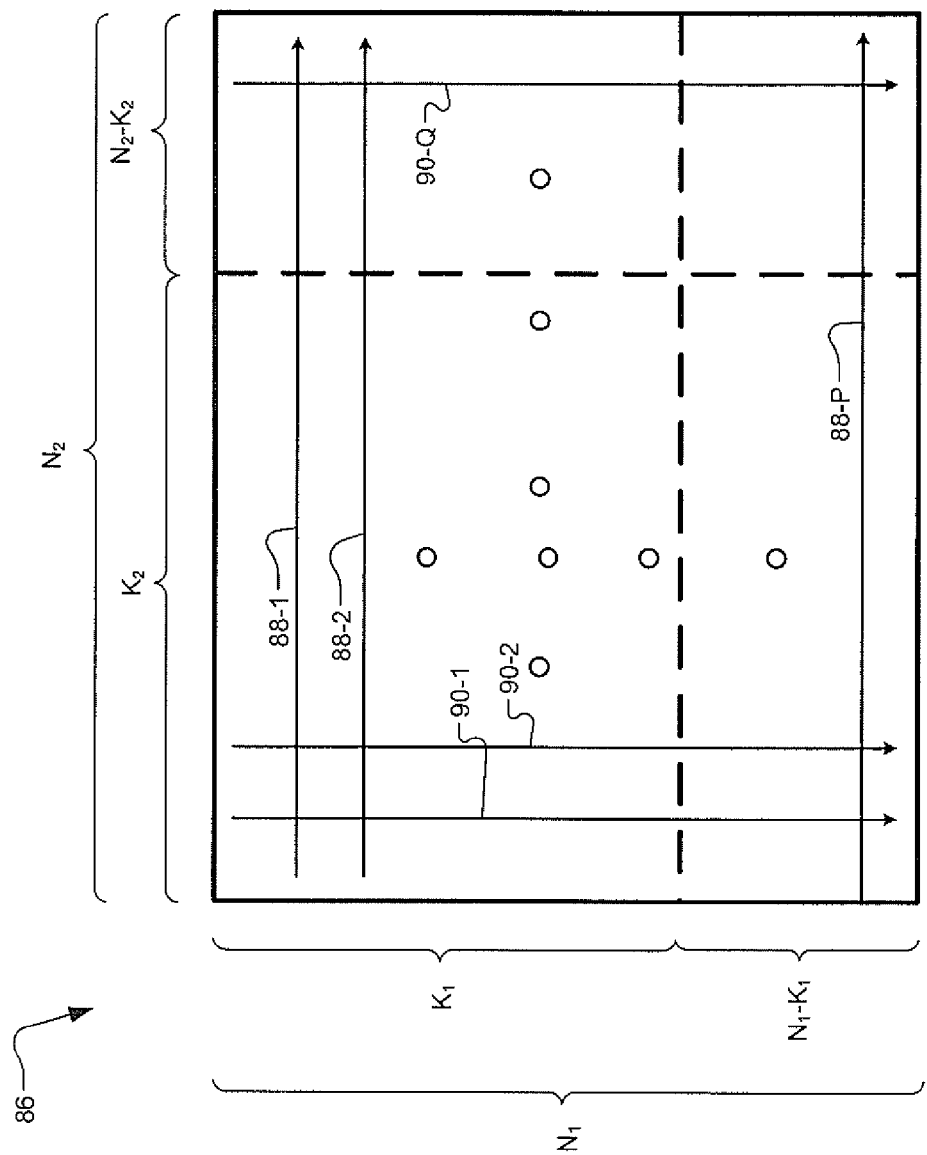

Referring now to FIG. 6B, the exemplary product code 86 of FIG. 6A is further illustrated. The row encoder 74 may encode each row 88-1, 88-2, ..., and 88-P of data, and each row may represent a codeword in $C_2$. The column encoder 76 may encode each column 90-1, 90-2, ..., and 90-Q, and each column may be a codeword in $C_1$. Either or both $C_1$ and $C_2$ may include, among others, Reed-Solomon (RS) codes, Bose-Chaudhuri-Hochquenghem (BCH) binary codes, and Hamming codes. $C_1$ and $C_2$ may also include cyclic redundancy codes (CRCs), Golay codes, Reed-Muller codes, Goppa codes, low-density parity-check (LDPC) codes, turbo codes convolutional codes, trellis coded modulation (TCM), block coded modulation (BCM), etc.

The overall code rate of the product code may be ($K_1 * K_2$)/($N_1 * N_2$). If $C_1$ has a minimum Hamming distance of d1, and $C_2$ has a Hamming minimum distance of d2, the product code may have a minimum Hamming distance of $d_1 \times d_2$.

Referring again to FIGS. 4 and 5, the product code encoder 58 may encode a product code dimension by dimension. For example, for the 2D product code in FIGS. 6A and 6B, each row may be encoded first using a row encoder 74. Encoded bits may be put into a matrix format. The product code encoder 58 may then encode each column using a column encoder 76. Alternatively, columns may be encoded prior to rows.

The product code decoder 72 may first decode each row with the row decoder 78 then decode each column with the column decoder 80 (or vice versa). The product code decoder 72 may receive stored data row by row or column by column from the demodulator 70. The decoder 72 may decode by rows first, which may allow correction of burst errors when data is received by columns, and vice versa. The subsequent column (or row) decoding may clean up miscorrections caused by row (or column) decoding.

In an alternative embodiment, the decoder 72 may base error detection on decoding for only one dimension. When the row decoder 78 detects errors on a row, the row decoder (or error correction module 82) marks that row as an erasure. Then, the column decoder 80 and the error correction module 82 perform both error and erasure decoding by utilizing the erasures marked by the row decoder 78.

The product code decoder 72 may iterate between row and column decoders 78, 80. First, the row decoder 78 may be used to correct each row. For each row, the row decoder 78 may store a number $m_P$ that is the number of symbols corrected in row 88-P. Larger values of $m_P$ may correspond to rows that are more likely to have been miscorrected. Uncorrectable rows may be assigned $m_P$="infinity", and the error correction module 82 may erase all of the symbols in that row.

The column decoder 80 may then be used to correct columns sequentially using an errors and erasures correction method. For example, if decoding fails because the column is uncorrectable or if decoding succeeds, but the decoding changes a symbol in an unerased row, some of the row decodings may have been incorrect. In this case, the error correction module 82 may erase the two least reliable unerased rows (rows with the largest values of $m_P$) and repeat the decoding for this column.

Figure 7:
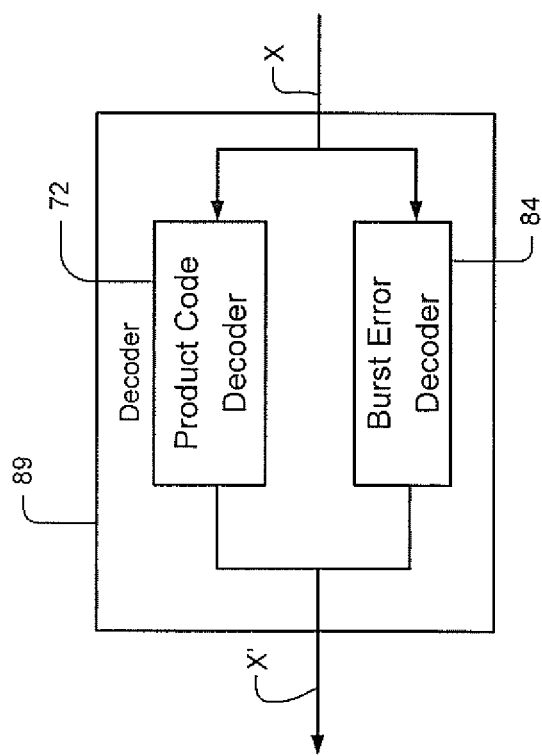
FIG. 7 is a functional block diagram of a product code decoder according to the present disclosure.

Referring now to FIG. 7, the product code may allow decoded burst errors and random errors together. Therefore, a burst error decoder 84 can run parallel to an iterative product code decoder 72 in a decoder module 89. Decoding may be considered successful if either decoder 72, 84 determines a valid codeword.

Figure 8:
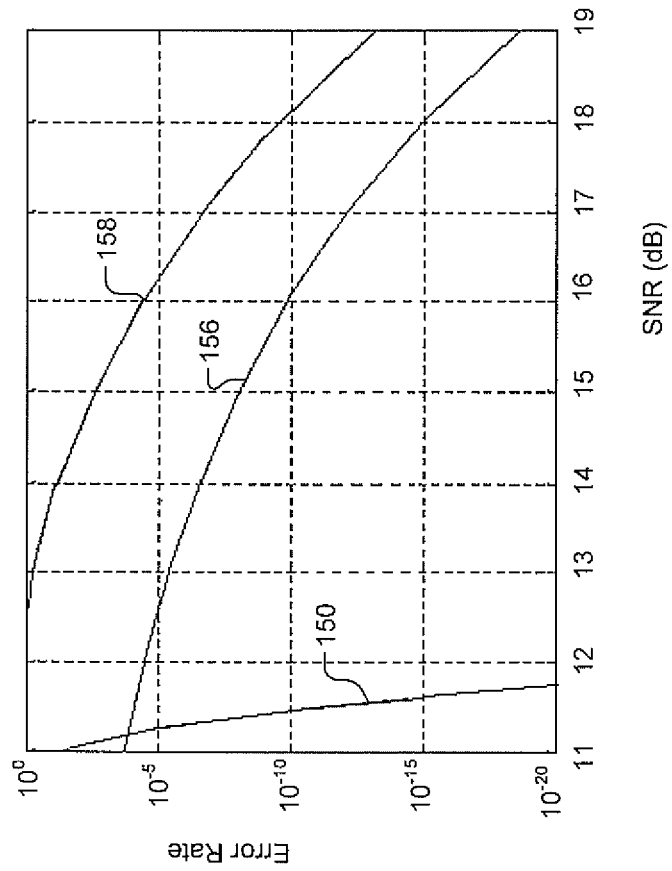
FIG. 8 is a graph that illustrates an exemplary performance of a non-volatile memory system.

Referring now to FIG. 8, an exemplary performance curve 150 of a 2D product code where $C_1$ and $C_2$ both include a BCH code is illustrated. Curve 150 shows the word error rate (WER) at the output of the product code decoder. Raw bit error rates (BERs) 156 and raw WERs 158 are also graphically illustrated based on error rates and signal-to-noise (SNR) ratios. In one example of the present disclosure, both $C_1$ and $C_2$ include (511, 466) binary BCH codes. Parameters of $C_1$ and $C_2$ may include $N_1=N_2=511$, $K_1=K_2=466$, $d_1=d_2=11$, i.e, each code can correct up to 5 bit errors. The product code may have a minimum Hamming distance $d_{min}=121$ and may correct up to 60 bits errors. The code rate is then 0.83. Resultant product code performance is plotted as the curve 150. Coding gain may be greater than 6.5 dB at WER of $1^{-10}$, which may be a comparable improvement over an uncoded system performance.

The large coding gain from product codes may allow an increase in the capacity and/or reliability of non-volatile memory systems. If the number of levels in each memory cell is increased from 4 levels to 8 levels, noise margin may decrease and therefore increase raw BER. The final WER from the product code decoder may be less than $10^{-13}$ when the raw BER is approximately $10^{-4}$.

Figure 9:
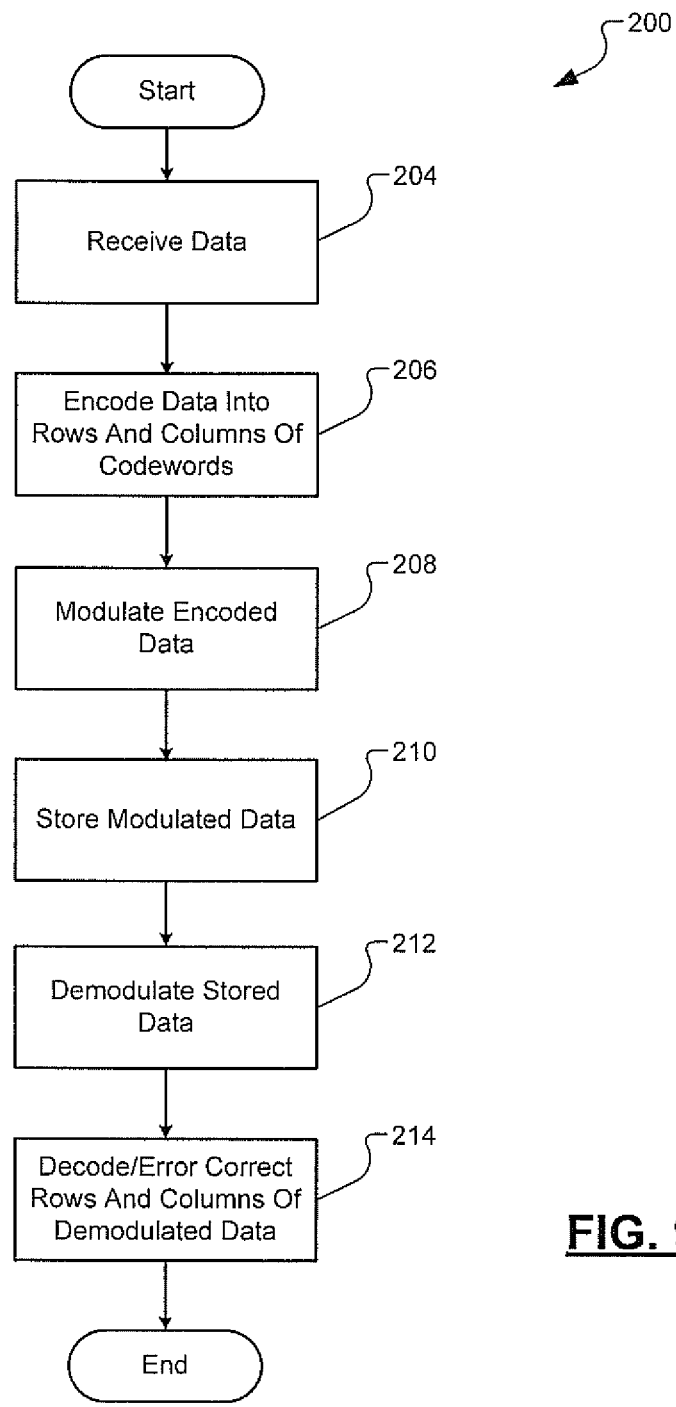
FIG. 9 is a block diagram that illustrates a method for encoding and decoding a non-volatile memory according to the present disclosure.

Referring now to FIG. 9, a block diagram 200 illustrates a method for encoding and decoding NV memory. The method starts in step 204 when data is received from a memory controller. In step 206 the data is encoded by a product code encoder into rows and columns of codewords. In step 208, a modulator modulates the encoded data. In step 210 the modulated data is stored in NV memory through a write operation. In step 212 the stored data is read from NV memory and demodulated. In step 214 the demodulated data is decoded and corrected for errors.

Figure 10:
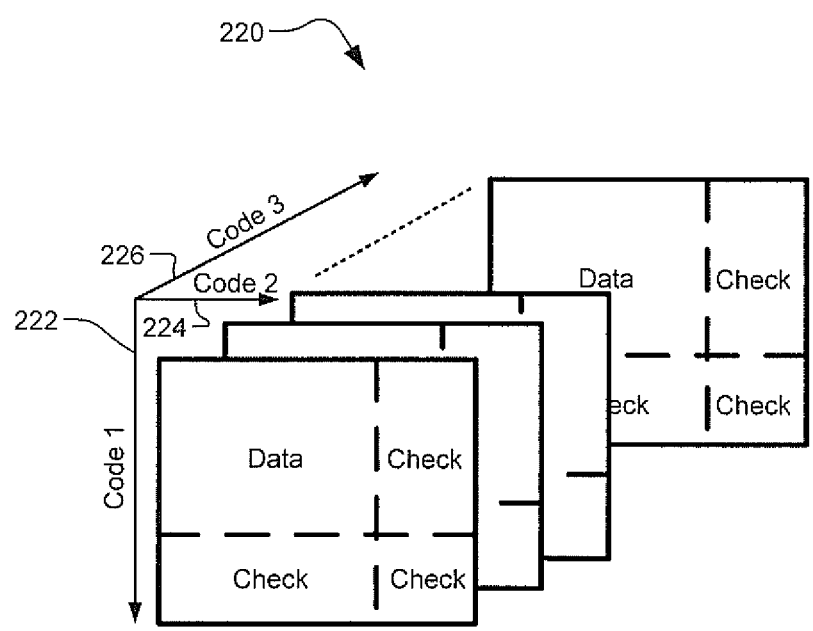
FIG. 10 is a schematic diagram of a three dimensional (3D) product code according to the present disclosure.

Referring now to FIG. 10, although the above example articulates 2D product codes, the present disclosure may also include three or more dimensions. For example, FIG. 10 shows a 3-dimension (3D) product code 220. The product code 220 is based on a product of codewords in the three dimensions such that $C_p=C_1 \times C_2 \times C_3$, where $C_1 \times C_2 \times C_3$ represent codes/codewords 222, 224, 226 in first, second, and third dimensions respectively. Further, each dimension may or may not be in a "rectangular" form. If encoder inputs are $X_0, X_1, \ldots X_{N-1}$, where $N=N_1 * N_2$, dimensions in the rectangular form can be expressed mathematically by a first (row) dimension $(X_i)$ such that $i=mN_2+z$, where $0 \le m < N_1$ is a row index. $0 \le z \le N_2$ enumerates all bits in the same row. Further, dimensions may be expressed by a second (column) dimension $(X_j)$ such that $j=sN_1+t$, where $0 \le s \le N_2$ is a column index; and $0 \le t < N_1$ enumerates all bits in the same column.

Other methods may be used to define each dimension. For example, rows may be used for the first dimension, and diagonals for the second dimension. For this arrangement, bits $X_0$ to $X_{N-1}$ are first arranged in a matrix form where each bit can be indexed by $X_{i,j}$. The dimensional is then defined mathematically as a first (row) dimension $(X_{i,j})$ where i is the row index, and j enumerates all the bits in the same row. Further, a second (diagonal) dimension $(X_{i,j})$ is defined such that i−j=m, where m is the diagonal index. All the (i,j) combinations that satisfy i−j=m may enumerate all the bits in the same diagonal.

Product code or other compound code may also be used as a constituent code for one or more dimensions. For example, in FIG. 6A, code 1 in the column dimension can be a product code. Using a product code as a constituent code may simplify the decoding for the corresponding dimension and achieve higher coding gain.

Figure 11A:
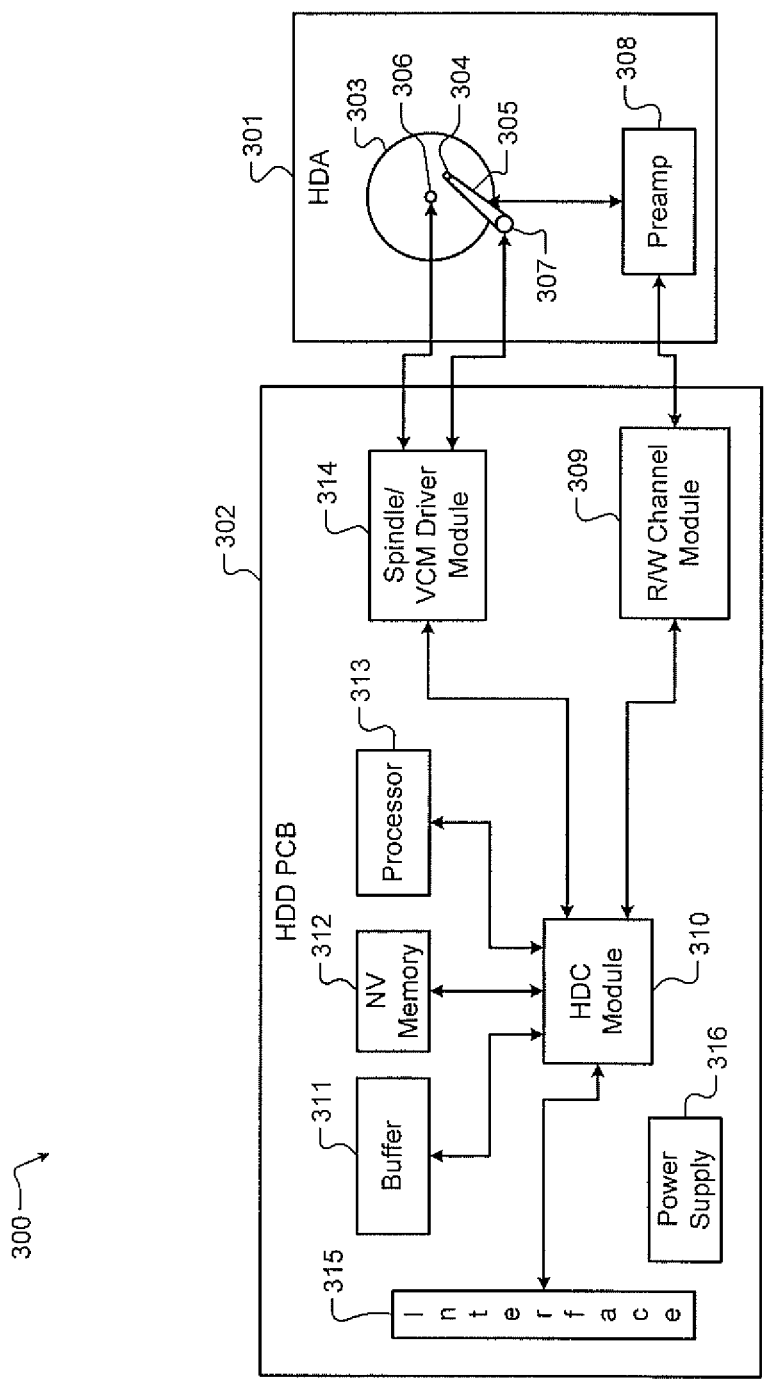
FIG. 11A is a functional block diagram of a hard disk drive.

Referring now to FIGS. 11A-11G, various exemplary implementations incorporating the teachings of the present disclosure are shown. Referring now to FIG. 11A, the teachings of the disclosure can be used to code, decode, and correct data for NV memory 312 of a hard disk drive (HDD) 300. The HDD 300 includes a hard disk assembly (HDA) 301 and a HDD PCB 302. The HDA 301 may include a magnetic medium 303, such as one or more platters that store data, and a read/write device 304. The read/write device 304 may be arranged on an actuator arm 305 and may read and write data on the magnetic medium 303. Additionally, the HDA 301 includes a spindle motor 306 that rotates the magnetic medium 303 and a voice-coil motor (VCM) 307 that actuates the actuator arm 305. A preamplifier device 308 amplifies signals generated by the read/write device 304 during read operations and provides signals to the read/write device 304 during write operations.

The HDD PCB 302 includes a read/write channel module (hereinafter, "read channel") 309, a hard disk controller (HDC) module 310, a buffer 311, NV memory 312, a processor 313, and a spindle/VCM driver module 314. The read channel 309 processes data received from and transmitted to the preamplifier device 308. The HDC module 310 controls components of the HDA 301 and communicates with an external device (not shown) via an I/O interface 315. The external device may include a computer, a multimedia device, a mobile computing device, etc. The I/O interface 315 may include wireline and/or wireless communication links.

The HDC module 310 may receive data from the HDA 301, the read channel 309, the buffer 311, nonvolatile memory 312, the processor 313, the spindle/VCM driver module 314, and/or the I/O interface 315. The processor 313 may process the data, including encoding, decoding, filtering, and/or formatting. The processed data may be output to the HDA 301, the read channel 309, the buffer 311, nonvolatile memory 312, the processor 313, the spindle/VCM driver module 314, and/or the I/O interface 315.

The HDC module 310 may use the buffer 311 and/or nonvolatile memory 312 to store data related to the control and operation of the HDD 300. The buffer 311 may include DRAM, SDRAM, etc. The nonvolatile memory 312 may include flash memory (including NAND and NOR flash memory), phase change memory, magnetic RAM, or multi-state memory, in which each memory cell has more than two states. The spindle/VCM driver module 314 controls the spindle motor 306 and the VCM 307. The HDD PCB 302 includes a power supply 316 that provides power to the components of the HDD 300.

Figure 11B:
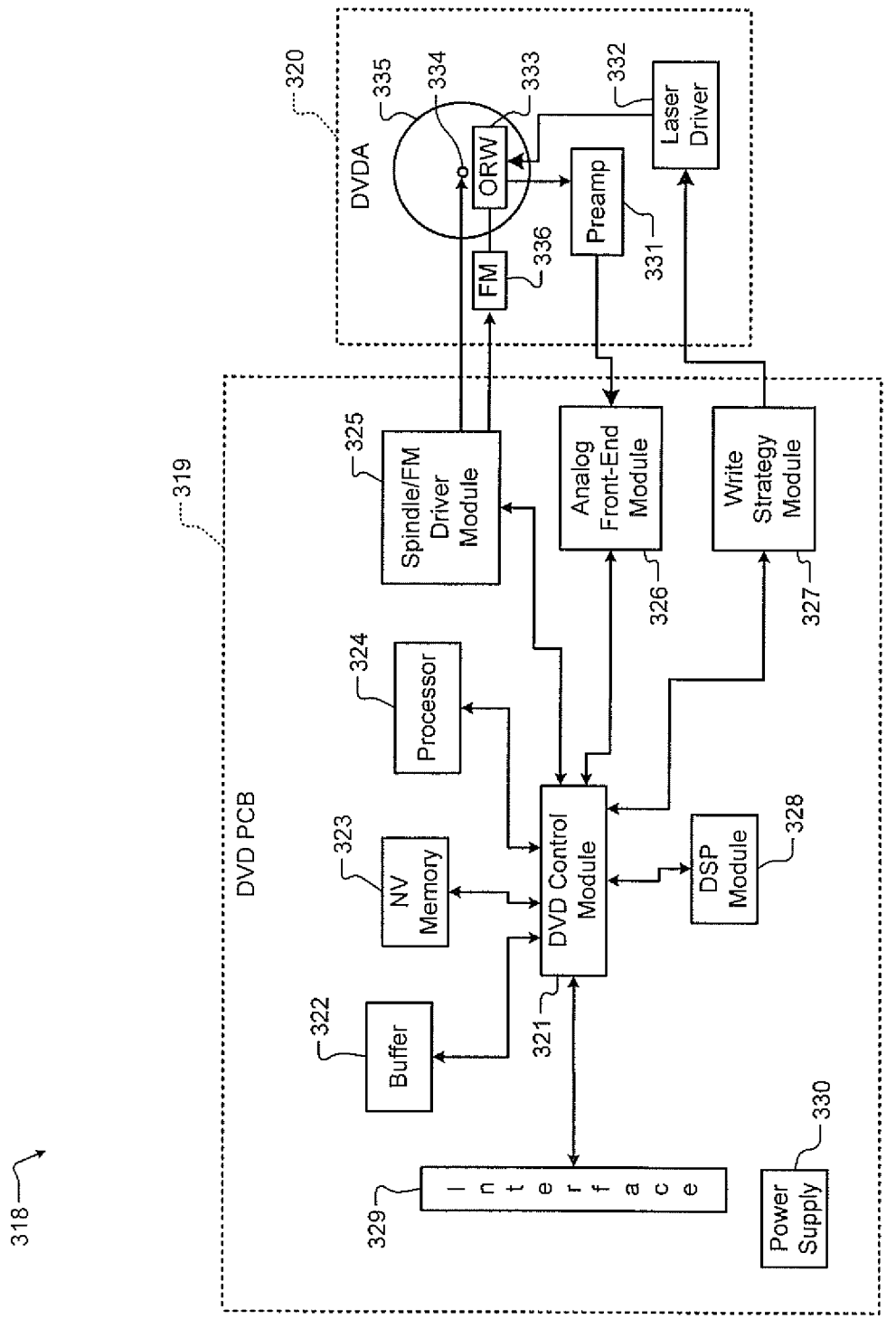
FIG. 11B is a functional block diagram of a DVD drive.

Referring now to FIG. 11B, the teachings of the disclosure can be used to code, decode, and correct data for NV memory 323 of a DVD drive 318 or of a CD drive (not shown). The DVD drive 318 includes a DVD PCB 319 and a DVD assembly (DVDA) 320. The DVD PCB 319 includes a DVD control module 321, a buffer 322, NV memory 323, a processor 324, a spindle/FM (feed motor) driver module 325, an analog front-end module 326, a write strategy module 327, and a DSP module 328.

The DVD control module 321 controls components of the DVDA 320 and communicates with an external device (not shown) via an I/O interface 329. The external device may include a computer, a multimedia device, a mobile computing device, etc. The I/O interface 329 may include wireline and/or wireless communication links.

The DVD control module 321 may receive data from the buffer 322, nonvolatile memory 323, the processor 324, the spindle/FM driver module 325, the analog front-end module 326, the write strategy module 327, the DSP module 328, and/or the I/O interface 329. The processor 324 may process the data, including encoding, decoding, filtering, and/or formatting. The DSP module 328 performs signal processing, such as video and/or audio coding/decoding. The processed data may be output to the buffer 322, nonvolatile memory 323, the processor 324, the spindle/FM driver module 325, the analog front-end module 326, the write strategy module 327, the DSP module 328, and/or the I/O interface 329.

The DVD control module 321 may use the buffer 322 and/or nonvolatile memory 323 to store data related to the control and operation of the DVD drive 318. The buffer 322 may include DRAM, SDRAM, etc. The nonvolatile memory 323 may include flash memory (including NAND and NOR flash memory), phase change memory, magnetic RAM, or multi-state memory, in which each memory cell has more than two states. The DVD PCB 319 includes a power supply 330 that provides power to the components of the DVD drive 318.

The DVDA 320 may include a preamplifier device 331, a laser driver 332, and an optical device 333, which may be an optical read/write (ORW) device or an optical read-only (OR) device. A spindle motor 334 rotates an optical storage medium 335, and a feed motor 336 actuates the optical device 333 relative to the optical storage medium 335.

When reading data from the optical storage medium 335, the laser driver provides a read power to the optical device 333. The optical device 333 detects data from the optical storage medium 335, and transmits the data to the preamplifier device 331. The analog front-end module 326 receives data from the preamplifier device 331 and performs such functions as filtering and A/D conversion. To write to the optical storage medium 335, the write strategy module 327 transmits power level and timing data to the laser driver 332. The laser driver 332 controls the optical device 333 to write data to the optical storage medium 335.

Figure 11D:
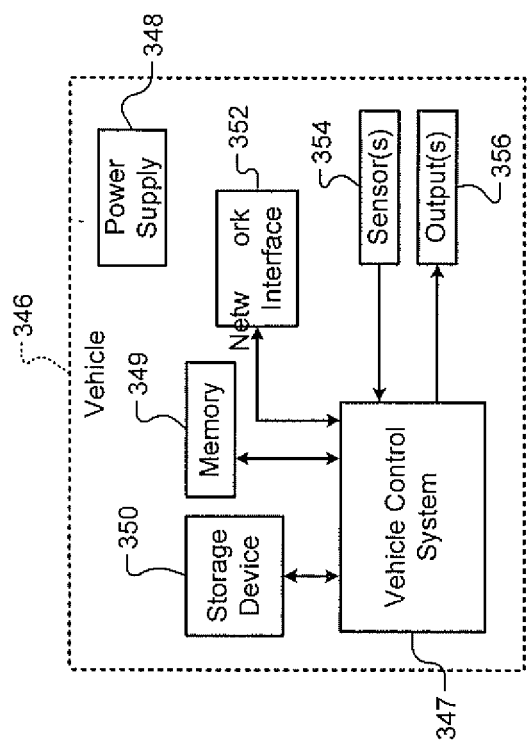
FIG. 11D is a functional block diagram of a vehicle control system.
Figure 11C:
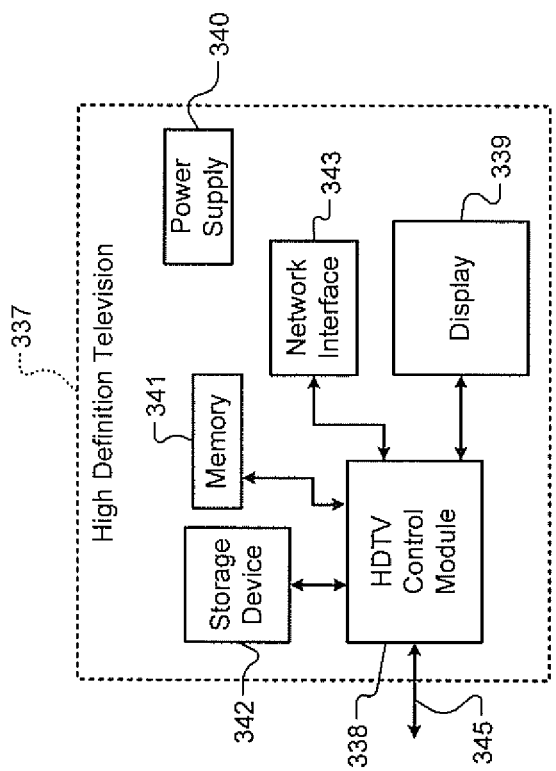
FIG. 11C is a functional block diagram of a high definition television.

Referring now to FIG. 11C, the teachings of the disclosure can be used to code, decode, and correct data for memory 341 of a high definition television (HDTV) 337. The HDTV 337 includes a HDTV control module 338, a display 339, a power supply 340, memory 341, a storage device 342, a network interface 343, and an external interface 345. If the network interface 343 includes a wireless local area network interface, an antenna (not shown) may be included.

The HDTV 337 can receive input signals from the network interface 343 and/or the external interface 345, which can send and receive data via cable, broadband Internet, and/or satellite. The HDTV control module 338 may process the input signals, including encoding, decoding, filtering, and/or formatting, and generate output signals. The output signals may be communicated to one or more of the display 339, memory 341, the storage device 342, the network interface 343, and the external interface 345.

Memory 341 may include random access memory (RAM) and/or nonvolatile memory such as flash memory, phase change memory, or multi-state memory, in which each memory cell has more than two states. The storage device 342 may include an optical storage drive, such as a DVD drive, and/or a hard disk drive (HDD). The HDTV control module 338 communicates externally via the network interface 343 and/or the external interface 345. The power supply 340 provides power to the components of the HDTV 337.

Referring now to FIG. 11D, the teachings of the disclosure can be used to code, decode, and correct data for NV memory 349 of a vehicle 346. The vehicle 346 may include a vehicle control system 347, a power supply 348, NV memory 349, a storage device 350, and a network interface 352. If the network interface 352 includes a wireless local area network interface, an antenna (not shown) may be included. The vehicle control system 347 may be a powertrain control system, a body control system, an entertainment control system, an anti-lock braking system (ABS), a navigation system, a telematics system, a lane departure system, an adaptive cruise control system, etc.

The vehicle control system 347 may communicate with one or more sensors 354 and generate one or more output signals 356. The sensors 354 may include temperature sensors, acceleration sensors, pressure sensors, rotational sensors, airflow sensors, etc. The output signals 356 may control engine operating parameters, transmission operating parameters, suspension parameters, etc.

The power supply 348 provides power to the components of the vehicle 346. The vehicle control system 347 may store data in memory 349 and/or the storage device 350. Memory 349 may include random access memory (RAM) and/or nonvolatile memory such as flash memory, phase change memory, or multi-state memory, in which each memory cell has more than two states. The storage device 350 may include an optical storage drive, such as a DVD drive, and/or a hard disk drive (HDD). The vehicle control system 347 may communicate externally using the network interface 352.

Referring now to FIG. 11E, the teachings of the disclosure can be used to code, decode, and correct data for NV memory 364 of a cellular phone 358. The cellular phone 358 includes a phone control module 360, a power supply 362, NV memory 364, a storage device 366, and a cellular network interface 367. The cellular phone 358 may include a network interface 368, a microphone 370, an audio output 372 such as a speaker and/or output jack, a display 374, and a user input device 376 such as a keypad and/or pointing device. If the network interface 368 includes a wireless local area network interface, an antenna (not shown) may be included.

The phone control module 360 may receive input signals from the cellular network interface 367, the network interface 368, the microphone 370, and/or the user input device 376. The phone control module 360 may process signals, including encoding, decoding, filtering, and/or formatting, and generate output signals. The output signals may be communicated to one or more of memory 364, the storage device 366, the cellular network interface 367, the network interface 368, and the audio output 372.

Memory 364 may include random access memory (RAM) and/or nonvolatile memory such as flash memory, phase change memory, or multi-state memory, in which each memory cell has more than two states. The storage device 366 may include an optical storage drive, such as a DVD drive, and/or a hard disk drive (HDD). The power supply 362 provides power to the components of the cellular phone 358.

Referring now to FIG. 11F, the teachings of the disclosure can be used to code, decode, and correct data for memory 383 of a set top box 378. The set top box 378 includes a set top control module 380, a display 381, a power supply 382, memory 383, a storage device 384, and a network interface 385. If the network interface 385 includes a wireless local area network interface, an antenna (not shown) may be included.

The set top control module 380 may receive input signals from the network interface 385 and an external interface 387, which can send and receive data via cable, broadband Internet, and/or satellite. The set top control module 380 may process signals, including encoding, decoding, filtering, and/or formatting, and generate output signals. The output signals may include audio and/or video signals in standard and/or high definition formats. The output signals may be communicated to the network interface 385 and/or to the display 381. The display 381 may include a television, a projector, and/or a monitor.

The power supply 382 provides power to the components of the set top box 378. Memory 383 may include random access memory (RAM) and/or nonvolatile memory such as flash memory, phase change memory, or multi-state memory, in which each memory cell has more than two states. The storage device 384 may include an optical storage drive, such as a DVD drive, and/or a hard disk drive (HDD).

Figure 11G:
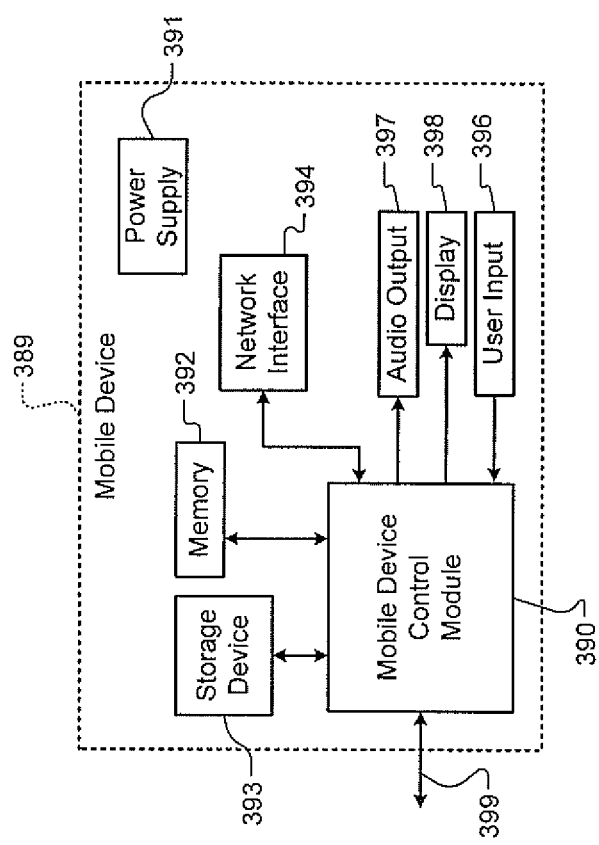
FIG. 11G is a functional block diagram of a mobile device.

Referring now to FIG. 11G, the teachings of the disclosure can be used to code, decode, and correct data for NV memory 392 of a mobile device 389. The mobile device 389 may include a mobile device control module 390, a power supply 391, NV memory 392, a storage device 393, a network interface 394, and an external interface 399. If the network interface 394 includes a wireless local area network interface, an antenna (not shown) may be included.

The mobile device control module 390 may receive input signals from the network interface 394 and/or the external interface 399. The external interface 399 may include USB, infrared, and/or Ethernet. The input signals may include compressed audio and/or video, and may be compliant with the MP3 format. Additionally, the mobile device control module 390 may receive input from a user input 396 such as a keypad, touchpad, or individual buttons. The mobile device control module 390 may process input signals, including encoding, decoding, filtering, and/or formatting, and generate output signals.

The mobile device control module 390 may output audio signals to an audio output 397 and video signals to a display 398. The audio output 397 may include a speaker and/or an output jack. The display 398 may present a graphical user interface, which may include menus, icons, etc. The power supply 391 provides power to the components of the mobile device 389. Memory 392 may include random access memory (RAM) and/or nonvolatile memory such as flash memory, phase change memory, or multi-state memory, in which each memory cell has more than two states. The storage device 393 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A memory storage system, comprising:
  a non-volatile semiconductor memory;
  product code encoder, including:
    a first encoder configured to encode data in codewords in a first dimension; and
    a second encoder configured to encode data in codewords in a second dimension, wherein the product code encoder is configured to provide, for storage, in the non-volatile semiconductor memory, a product code codeword based on the codewords in the first dimension and the codewords in the second dimension;
  a modulator configured to map bits of the product code codeword to corresponding voltage levels in cells of the non-volatile semiconductor memory;
  a demodulator configured to i) read the voltage levels in the cells, and ii) translate the voltage levels into bits corresponding to the product code codeword; and
  a decoder, including:
    a product code decoder configured to perform iterative decoding on the product code codeword; and
    a burst code decoder configured to perform, in parallel with the iterative decoding, burst error decoding on the product code codeword.

2. The memory storage system of claim 1, further comprising:
  a write path including i) the product code encoder, and ii) the modulator; and
  a read path including i) the demodulator, and ii) the decoder.

3. The memory storage system of claim 1, wherein the non-volatile semiconductor memory comprises a single-level cell non-volatile semiconductor memory or a multi-level cell non-volatile semiconductor memory.

4. The memory storage system of claim 1, wherein each of the first encoder and the second encoder is configured to encode according to Bose-Chaudhuri-Hochquenghem coding.

5. The memory storage system of claim 1, wherein the product code encoder is configured to iterate between the codewords in the first dimension and the codewords in the second dimension.

6. The memory storage system of claim 1, wherein the decoder is configured to store an indication of a number of symbols of the codewords in the first dimension that are corrected during decoding.

7. The memory storage system of claim 6, wherein the decoder is configured to selectively erase the codewords in the first dimension based on the indication.

8. A method, comprising:
encoding data in codewords in a first dimension;
encoding data in codewords in a second dimension;
providing, for storage in a non-volatile semiconductor memory, a product code codeword based on the codewords in the first dimension and the codewords in the second dimension;
mapping bits of the product code codeword to corresponding voltage levels in cells of the non-volatile semiconductor memory;
reading the voltage levels in the cells;
translating the voltage levels into bits corresponding to the product code codeword;
performing iterative decoding on the product code codeword; and
performing, in parallel with the iterative decoding, burst error decoding on the product code codeword.

9. The method of claim 8, wherein the non-volatile semiconductor memory comprises a single-level cell non-volatile semiconductor memory or a multi-level cell non-volatile semiconductor memory.

10. The method of claim 8, wherein the encoding the data in the codewords in the first dimension and the encoding the data in the codewords in the second dimension include encoding according to Bose-Chaudhuri-Hochquenghem coding.

11. The method of claim 8, wherein the encoding the data in the codewords in the first dimension and the encoding the data in the codewords in the second dimension include iterating between the codewords in the first dimension and the codewords in the second dimension.

12. The method of claim 8, further comprising storing an indication of a number of symbols of the codewords in the first dimension that are corrected during decoding.

13. The method of claim 12, further comprising selectively erasing the codewords in the first dimension based on the indication.

* * * * *